US010270245B2

(12) United States Patent
Simbuerger et al.

(10) Patent No.: US 10,270,245 B2
(45) Date of Patent: Apr. 23, 2019

(54) INTEGRATED CIRCUIT DEVICE AND A DEVICE FOR PROTECTION OF A CIRCUIT

(71) Applicant: Infineon Technologies AG, Neubiberg (DE)

(72) Inventors: Werner Simbuerger, Haar (DE); Winfried Bakalski, Putzbrunn (DE); Georg Lischka, Poing (DE); Andreas Wiesbauer, Poertschach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/900,228

(22) Filed: Feb. 20, 2018

(65) Prior Publication Data
US 2018/0241204 A1    Aug. 23, 2018

(30) Foreign Application Priority Data
Feb. 23, 2017   (DE) .................. 10 2017 103 803

(51) Int. Cl.
H02H 9/04        (2006.01)
H01L 27/02       (2006.01)
H04R 3/00        (2006.01)
H01L 49/02       (2006.01)
H01L 29/747      (2006.01)

(52) U.S. Cl.
CPC ......... H02H 9/046 (2013.01); H01L 27/0288 (2013.01); H01L 27/0292 (2013.01); H04R 3/007 (2013.01); H01L 27/0255 (2013.01); H01L 27/0262 (2013.01); H01L 28/10 (2013.01); H01L 29/747 (2013.01)

(58) Field of Classification Search
None
See application file for complete search history.

(56) References Cited

U.S. PATENT DOCUMENTS

| 2003/0006856 | A1* | 1/2003 | Miller ............... H01L 23/5227 333/32 |
| 2003/0044033 | A1* | 3/2003 | Julstrom ............ H04R 25/43 381/315 |
| 2005/0088241 | A1 | 4/2005 | Behzad |
| 2007/0121967 | A1 | 5/2007 | Sjursen et al. |
| 2014/0254051 | A1 | 9/2014 | Srivastava et al. |

(Continued)

OTHER PUBLICATIONS

Wikipedia, Class-D Amplifier, Jan. 2016, (https://web.archive.org/web/20160114170148/https://en.wikipedia.org/wiki/Class-D_amplifier) (Year: 2016).*

(Continued)

Primary Examiner — Mark Fischer
(74) Attorney, Agent, or Firm — Shumaker & Sieffert, P.A.

(57) ABSTRACT

An integrated circuit device comprises at least one non-linear circuit. Further the integrated circuit device comprises a plurality of terminal circuits coupled to the non-linear circuit. Each terminal circuit comprises an associated terminal and an inductor coupled to the associated terminal and to the at least one non-linear circuit. A protective device for protection of a circuit, comprises an electro-static discharge protection element configured to be coupled to a circuit terminal and an inductor coupled to the electro-static discharge protection element and configured to be coupled to the circuit. The inductor has a low quality factor.

26 Claims, 3 Drawing Sheets

(56) References Cited

U.S. PATENT DOCUMENTS

2015/0097620 A1  4/2015  Adamski
2016/0057529 A1  2/2016  Kappus et al.
2016/0149543 A1  5/2016  Anderson et al.

OTHER PUBLICATIONS

English human translation of Office Action, in the German language, from counterpart German Application No. 102017103803.5, dated Dec. 1, 2017 (Year: 2017).*
Office Action, in the German language, from counterpart German Application No. 102017103803.5, dated Dec. 1, 2017, 10 pp.

* cited by examiner

INTEGRATED CIRCUIT DEVICE AND A DEVICE FOR PROTECTION OF A CIRCUIT

This Application claims priority to German Application Number 10 2017 103 803.5, filed on Feb. 23, 2017, the entire content of which is incorporated herein by reference.

BACKGROUND

Tiny microphone modules are used, for example, in mobile devices. Where a mobile device has a radio frequency antenna, noise due to radio frequency interference (RFI) can disturb the audio signal to be transmitted.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Described herein are techniques that can be useful, for example, in mobile devices. Embodiments disclosed herein encompass an integrated circuit device, a device for protection of a circuit and a microphone circuit.

In an aspect, a method comprises an integrated circuit (IC) device. The IC device comprises at least one non-linear circuit and a plurality of terminal circuits coupled to the non-linear circuit. Each terminal circuit comprises an associated terminal and an inductor coupled between the associated terminal and the at least one non-linear circuit. The inductor has a low quality factor.

In an aspect, a device for protection of a circuit comprises an electro-static discharge protection element configured to be coupled to a circuit terminal. Further, the device comprises an inductor configured to be coupled between the electro-static discharge protection element and the circuit. The inductor has a low quality factor.

In an aspect, a microphone circuit comprises a transducer, an amplifier circuit that is coupled to the transducer, and a plurality of terminal circuits that are coupled to the amplifier circuit. The transducer is configured to provide an electrical signal that represents a pressure variation. The amplifier circuit is configured to amplify the electrical signal. Each terminal circuit comprises an associated terminal and an inductor coupled between the associated terminal and the amplifier circuit. The inductor has a low quality factor.

The independent claims define the invention in various aspects. The dependent claims state selected elements of embodiments according to the invention in various aspects.

This summary is submitted with the understanding that it will not be used to interpret or limit the scope or meaning of the claims. This summary is not intended to identify key features or essential features of the claimed subject matter, nor is it intended to be used as an aid in determining the scope of the claimed subject matter. Other methods, apparatus and systems are also disclosed. Those skilled in the art will recognise additional features and advantages upon reading the following detailed description, and upon viewing the accompanying drawings.

BRIEF DESCRIPTION OF THE DRAWINGS

The claimed subject matter is described below with reference to the drawings. As used herein, like terms refer to like elements throughout the description. The detailed description references the accompanying figures. The same numbers can be used throughout the drawings to reference like features and components. It should be noted that views of exemplary embodiments are merely to illustrate selected features of the embodiment.

DETAILED DESCRIPTION

For purposes of explanation, numerous specific details are set forth in order to provide a thorough understanding of the claimed subject matter. It may be evident, however, that the claimed subject matter may be practised without these specific details.

Generally, an integrated circuit device comprises at least one non-linear circuit and a plurality of terminal circuits coupled to the non-linear circuit. Generally, each terminal circuit comprises an associated terminal and an inductor coupled to the associated terminal and to the at least one non-linear circuit. The inductor has a low quality factor. In some embodiments, the quality factor of the inductor is less than 10. In some embodiments, the quality factor of the inductor is less than 1.

Figure 1:
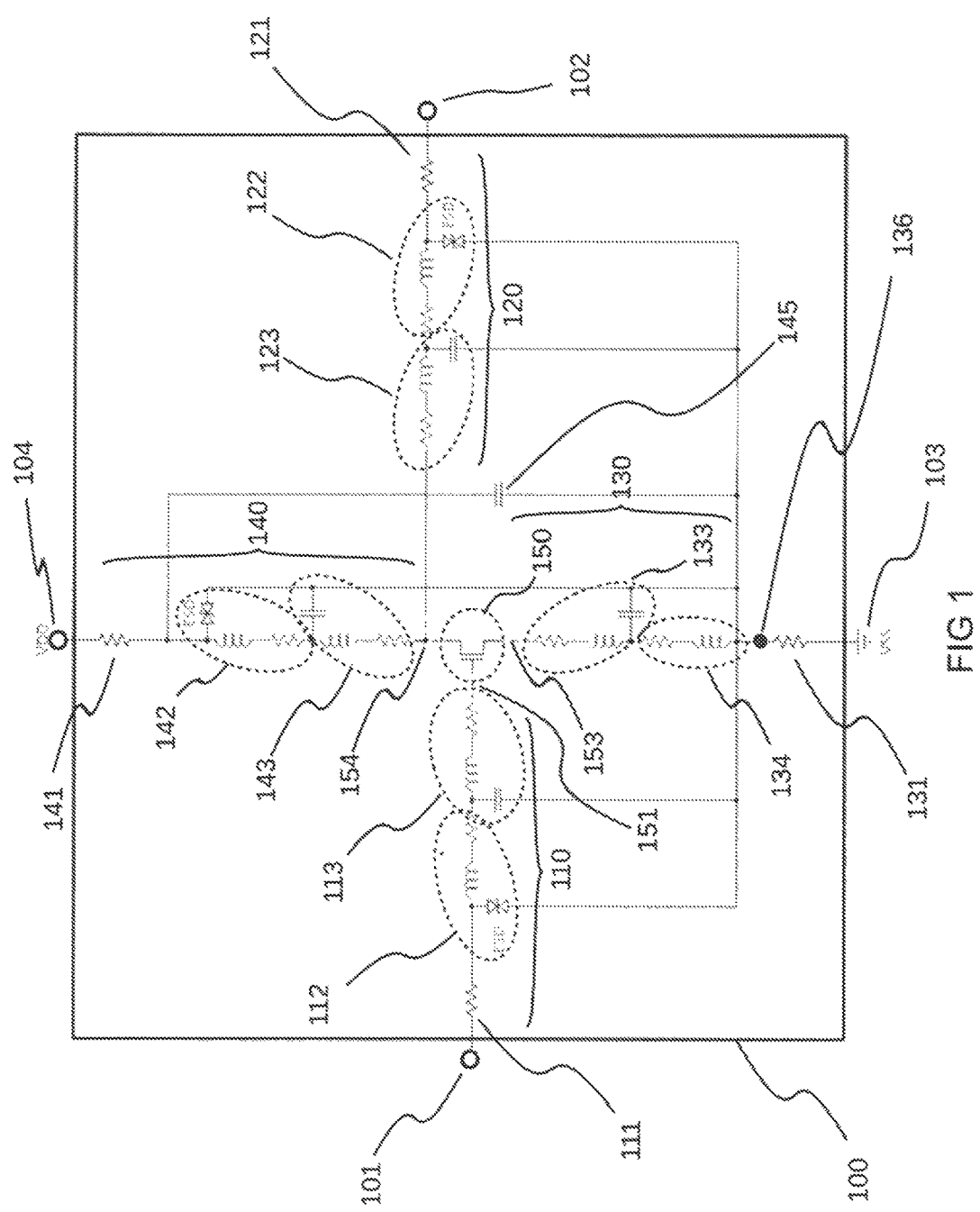
FIG. 1 is a schematic diagram that illustrates a circuit according to some embodiments.

In some embodiments, the inductor is coupled in series between the associated terminal and the at least one non-linear circuit. FIG. 1 is a schematic diagram that illustrates a circuit according to some embodiments. The circuit can, for example, form part of an integrated circuit (IC) device 100 that is configured to provide functionality, in particular non-linear functionality, wherein an output signal of the circuit non-linearly depends on an input signal. In some implementations, the circuit forms part of a microphone circuit. The IC device 100 may, for example, be configured to amplify an electrical signal received from a transducer (not shown). In some implementations, the circuit forms part of a microphone circuit.

The IC device 100 comprises an input node 101 configured to be coupled, for example, to an output terminal of the transducer. In some implementations, the IC device 100 is configured to provide an output signal at an output node 102. The IC device 100 further comprises a ground node 103 and a voltage supply node 104. In some implementations, the ground node 103 is coupled to a voltage source (not shown) that operates at a predetermined negative supply voltage, herein also referred to as ground voltage VSS. The voltage supply node 104 is coupled to a current source that, for example, is adapted to provide current at a predetermined positive supply voltage VDD. Herein, a difference between the positive supply voltage VDD and the ground voltage VSS can be referred to as operating voltage of the IC device 100. If the ground voltage VSS is zero, then the operating voltage corresponds to the positive supply voltage VDD.

The circuit of the IC device 100 includes an active circuit portion 150. In the example illustrated in FIG. 1, the active circuit portion is provided as a metal oxide semiconductor field effect transistor (MOSFET). It should be understood that the MOSFET is only to provide an example for the purpose of illustration; any other circuit could form the active circuit portion such as a processor core, an application specific integrated circuit (ASIC), and so forth.

A gate 151 of the MOSFET is coupled, by a gate coupling circuit 110, to the input signal node 101 of the IC device 100. A source terminal of the MOSFET is coupled, by a source coupling circuit 130, to the ground node 103 of the IC device 100. Herein, the source terminal is also referred to as an emitter node 153. A drain terminal of the MOSFET is coupled, by a drain coupling circuit 140, to the voltage supply node 104 of the IC device 100. Herein, the drain terminal is also referred to as collector node 154. Further, the collector node 154 is coupled, by an output coupling circuit 120, to the output terminal 102 of the IC device 100.

The IC device 100, in general, and, in particular, the MOSFET as the active circuit portion 150 of the IC device 100, is protected against overcurrent that can occur at one or more of the input node 101, the output node 102, the ground node 103 and the voltage supply node 104. At least one effect can, for example, be to provide some protection against a transient current spike caused by an electrostatic discharge (ESD). To this end, the gate coupling circuit 110, the output coupling circuit 120 and the drain coupling circuit 140, can each comprise an ESD robust resistor 111, 121, 141 that is configured to withstand a current significantly larger than a current that is expected to typically flow in operation of the IC device 100. Likewise, the ground node 103 is connected to one end of an ESD robust resistor 131. At least one effect can be to provide, at a virtual ground node 136 on the other end of the ESD robust resistor 131, a virtual ground internal to the IC device 100.

Generally, a protective device for protection of a circuit, such as the gate coupling circuit 110, the output coupling circuit 120 and the drain coupling circuit 140, comprises an electrostatic discharge (ESD) protection element configured to be coupled to a circuit terminal. Further, the protective device for protection of a circuit generally comprises an inductor coupled to the electrostatic discharge protection element and configured to be coupled to the circuit.

Now, still with reference to FIG. 1, in some embodiments, in the IC device 100, the gate coupling circuit 110 comprises an ESD protection sub-circuit 112. An input to the ESD protection sub-circuit 112 is connected to the ESD robust resistor 111 and an output from the ESD protection sub-circuit 112 is coupled to the active circuit portion 150 of the IC device 100. More particularly, in the example, the ESD protection sub-circuit 112 is coupled to the gate 151 of the MOSFET. Further, for overload protection, the ESD protection sub-circuit 112 is connected to the virtual ground node 136. As will be described in more detail below, the ESD protection sub-circuit 112 can be configured to form a first filter having a first pole. In particular, the ESD protection sub-circuit 112 can be operative as a low-pass filter that rejects high frequency voltages and directs currents caused by rapid voltage changes to ground. Thus, the active circuit portion 150 is protected from rapidly occurring current spikes. At least one effect can be that the ESD protection sub-circuit 112 can contribute to protection of the active circuit portion 150 against an electro-static discharge. The ESD protection sub-circuit 112 will be described shortly in more detail with reference to FIG. 2.

Figure 2:
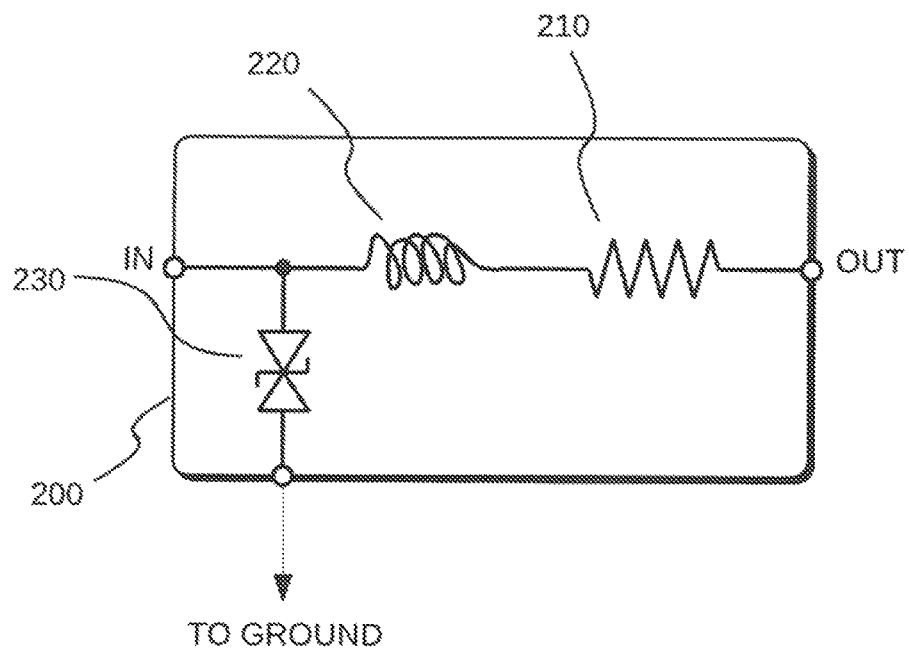
FIG. 2 illustrates a circuit diagram of an exemplary ESD protection circuit according to some embodiments.

FIG. 2 illustrates a circuit diagram of an exemplary ESD protection circuit 200 according to some embodiments. The ESD protection circuit 200 includes an ESD protection element 230 that can be connected to a reference voltage source such as ground. In some embodiments, the ESD protection element is provided as an ESD diode. In some implementations the ESD protection element 230 is provided as a thyristor such as a triac or a silicon controlled rectifier (SCR). At least one effect of the ESD protection circuit 200 can be that the ESD protection element 230 can be operative as a shunt for large currents to ground.

Further, the ESD protection circuit comprises an inductor 220. The inductor 220 is configured as a choke element to be coupled in series between, generally the ESD protection element 230, i.e., in the example of FIG. 2 the ESD SCR, and the non-linear circuit of the IC device, i.e., the active circuit portion 150. In accordance with the concepts disclosed herein, the inductor 220 has a low quality factor. In some embodiments, the quality factor of the inductor is less than 10. In some embodiments, the quality factor of the inductor is less than 1. In some implementations, the resistor 210 is implemented as a line resistance of the inductor 220. Thus, in effect, the resistor 210 is connected in series to the inductor 220. At least one effect of the ESD protection circuit 200 can be that resistor 210 and inductor 220 are operative to suppress transient currents. Because of the resistance 220, the attenuation effect is spread in a wider band of frequencies. Thus, while providing a single-pole low-pass filter function of the ESD protection circuit 200, a rejection of voltage peaks having a broad high-frequency spectrum is improved when compared to conventional techniques.

In some implementations, the inductor 220 of the ESD protection circuit 200 comprises a plurality of windings. For example, in one arrangement, the windings can be comprised in a conductive spiral formed in one metal layer. In some embodiments, the windings are comprised in a coil formed as windings in several metal layers. In one embodiment, the windings, in a perpendicular projection onto a substrate plane, project onto one another. In still another embodiment, the windings are comprised in a plurality of metal layers and, in a perpendicular projection onto the substrate plane, the windings spiral out. At least one effect can be to reduce a parasitic capacitance between windings in different layers. One effect can be to reduce also a risk of insulation breakdown between windings in adjacent metal layers.

Now again with reference to FIG. 1, in some embodiments, the gate coupling circuit 110 also comprises a protective filter sub-circuit 113. The protective filter sub-circuit 113 can be connected to the active circuit portion 150 of the IC device 100, i.e., to the gate node 151 of the MOSFET. In some implementations, the protective filter sub-circuit is connected in series between the ESD protection sub-circuit 112 and the gate node 151. As will be described in more detail below, in some implementations, the protective filter sub-circuit 113 is configured to form a second filter having a second pole. In some embodiments, the second pole differs from the first pole of the ESD protection sub-circuit 112. At least one effect of providing a filter with a plurality of poles, in particular a high order filter, can be that a rejection of rapid surges in current due to sudden voltage spikes and a redirection of such currents to ground can be improved. Thus, a protection of the IC device against adverse effects of radio frequency injections can be improved.

For overload protection, the protective filter sub-circuit 113 is connected to the virtual ground node 136. The protective filter sub-circuit 113 will be described in more detail below with reference to FIG. 3.

Figure 3:
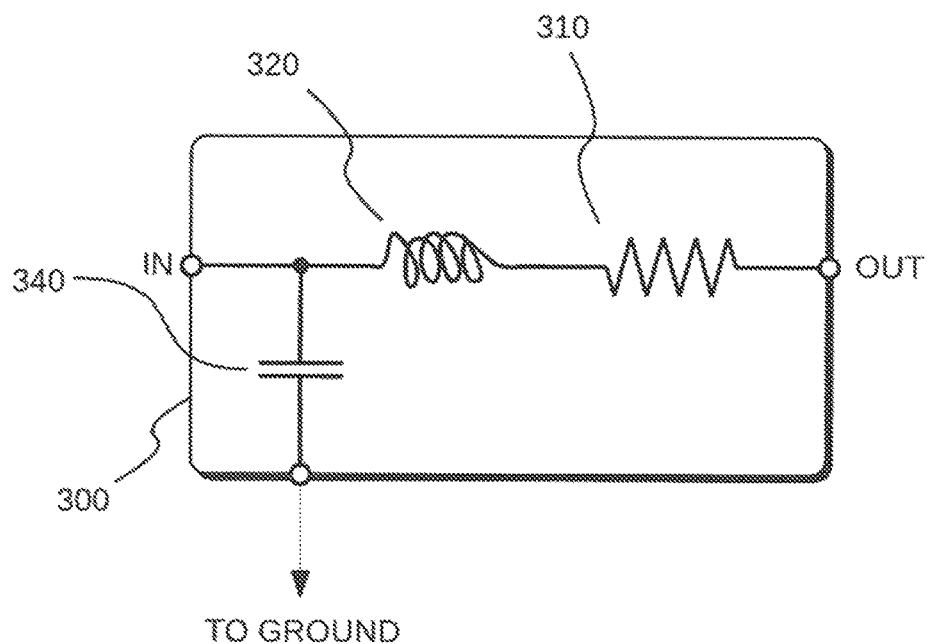
FIG. 3 illustrates a circuit diagram of an exemplary ESD protection circuit according to some embodiments.

FIG. 3 illustrates a circuit diagram of an ESD protection circuit according to some embodiments. The ESD protection circuit 300 forms an RLC filter having a resistor 310 and an inductor 320 connected in series. In some implementations, the resistor is implemented as a line resistance of the inductor 320. Further, the ESD protection circuit 300 comprises capacitor 340 that can be connected to some reference voltage source such as ground. Thus, the inductor 320 is configured to be coupled in series between, generally the capacitor 340, and the non-linear circuit.

In some implementations, as already described above with reference to the ESD protection circuit 200, the inductor 320 of the ESD protection circuit 300 comprises a plurality of windings. In particular, in some embodiments, the inductor 320 has a low quality factor. In some embodiments, the quality factor of the inductor is less than 10. In some embodiments, the quality factor of the inductor is less than 1.

Now, again with reference to FIG. 1, the output coupling circuit 120 further comprises an ESD protection sub-circuit 122 and a protective filter sub-circuit 123. The ESD protection sub-circuit 122 is connected to the ESD robust resistor 121 and coupled to the protective filter sub-circuit 123. Further, for overload protection, the ESD protection sub-circuit 122 is connected to the virtual ground node 136. The ESD protection sub-circuit 122 is of the type of the ESD protection circuit 200 described above with reference to FIG. 2. The protective filter sub-circuit 123 can be connected to the active circuit portion of the IC device 100, i.e., to the drain terminal, i.e., the collector node 154 of the MOSFET. Further, for overload protection, the protective filter sub-circuit 123 is connected to the virtual ground node 136. The protective filter sub-circuit 123 is of the type of the ESD protection circuit 300 described above with reference to FIG. 3.

The source coupling circuit 130 further comprises an ESD protection sub-circuit 134 and a protective choke sub-circuit 133. The ESD protection sub-circuit 134 is connected to the virtual ground node 136, i.e., to the ESD robust resistor 131, and coupled to the protective choke sub-circuit 133. The ESD protection sub-circuit 134 will be described shortly with reference to FIG. 4. The protective choke sub-circuit 133 can be connected to the active circuit portion of the IC device 100, i.e., to the source terminal, i.e., the emitter node 153 of the MOSFET. Further, for overload protection, the protective choke sub-circuit 133 is connected to the virtual ground node 136. The protective choke sub-circuit 133 is of the type of the ESD protection circuit 300 described above with reference to FIG. 3.

Figure 4:
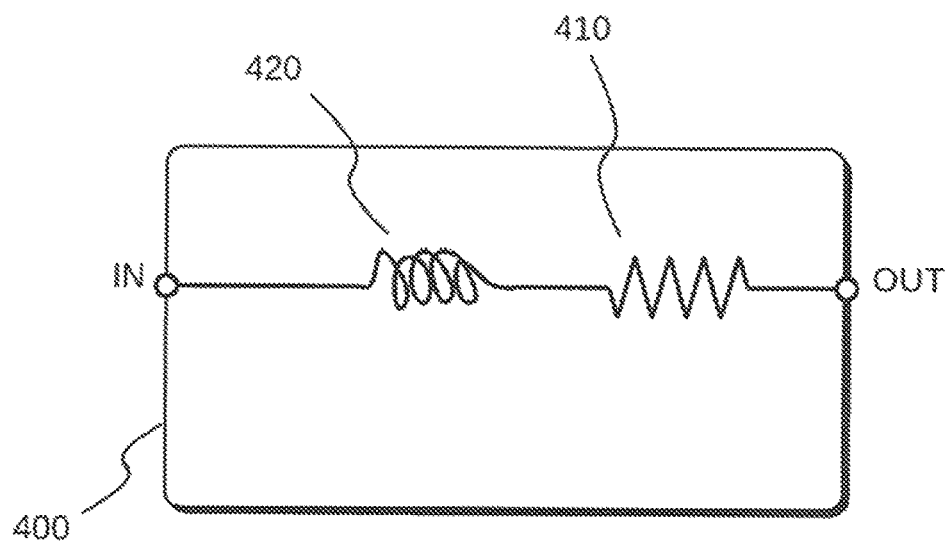
FIG. 4 illustrates a circuit diagram of an exemplary filter circuit according to some embodiments.

FIG. 4 illustrates a circuit diagram of an exemplary choke circuit 400 according to some embodiments. The choke circuit 400 forms an RL filter having a resistor 410 and an inductor 420 connected in series. In some implementations, the resistor 410 is implemented as a line resistance of the inductor 420. Thus, the inductor 420 is configured to be coupled in series between terminal 101 of the IC device 100 and the non-linear circuit such as the MOSFET. In accordance with the concepts disclosed herein, the inductor 320 has a low quality factor.

In some implementations, as already described above with reference to the ESD protection circuit 200, the inductor 420 of the choke circuit 400 comprises a plurality of windings. In particular, in some embodiments, the inductor 420 has a low quality factor. In some embodiments, the quality factor of the inductor is less than 10. In some embodiments, the quality factor of the inductor is less than 1.

Now, again with reference to FIG. 1, the drain coupling circuit 140 comprises an ESD protection sub-circuit 142, and a protective filter sub-circuit 143. The ESD protection sub-circuit 142 is connected to the ESD robust resistor 141 and coupled to the protective filter sub-circuit 143. Further, for overload protection, the ESD protection sub-circuit 142 is connected to the virtual ground node 136. The ESD protection sub-circuit 142 is of the type of the ESD protection circuit 200 described above with reference to FIG. 2. The protective filter sub-circuit 143 can be connected to the active circuit portion of the IC device 100, i.e., to the drain terminal, i.e., the collector node 154 of the MOSFET. Further, for overload protection, the protective filter sub-circuit 143 is connected to the virtual ground node 136. The protective filter sub-circuit 143 is of the type of the ESD protection circuit 300 described above with reference to FIG. 3.

In some embodiments, the voltage supply node 104 is coupled via a shunt circuit to the ground node 103. In the IC device 100 illustrated in FIG. 1, for example, the shunt circuit comprises a shunt capacitor 145 connected between the ESD robust resistor 141 and the virtual ground node 136. In an alternate embodiment (not shown), there is no shunt capacitor to by-pass the active circuit portion of the IC device. At least one effect can be that the virtual ground of the IC device is protected from injection of radiofrequency voltages and/or currents.

Figure 5:
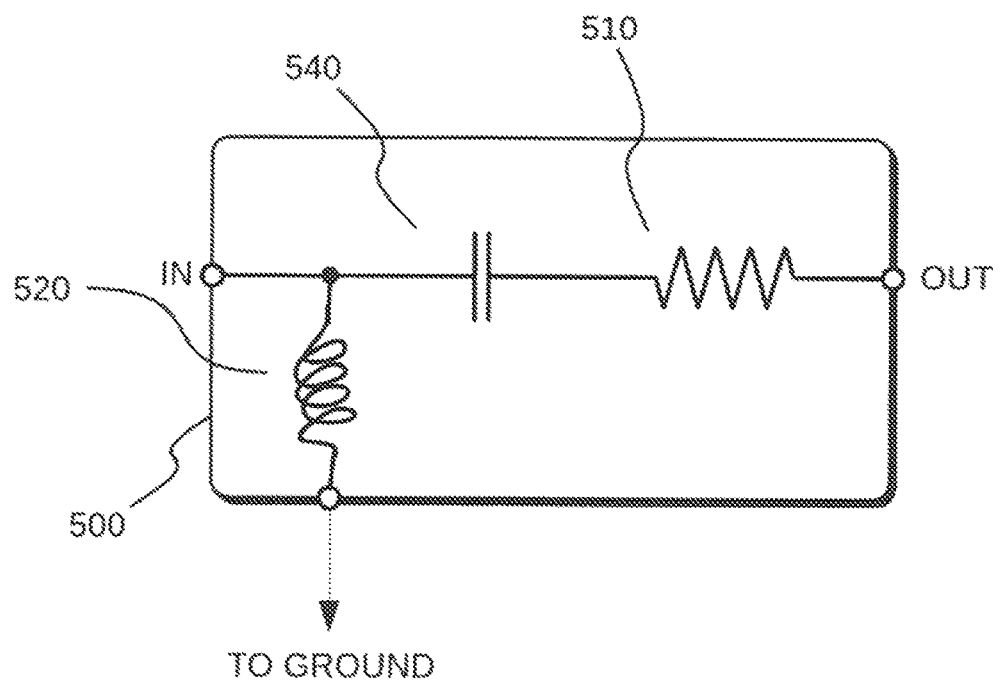
FIG. 5 illustrates a circuit diagram of an exemplary filter circuit according to some embodiments.

In an alternate embodiments of the filter circuit, the inductor is coupled from a node between the associated filter circuit's terminal and the at least one non-linear circuit to ground. In particular, the inductor can be coupled from a node between the ESD protection element and the circuit to ground. FIG. 5 illustrates a circuit diagram of an exemplary protective filter circuit 500 according to some embodiments. The protective filter circuit 500 is similar to the ESD protection circuit 300 described above with reference to FIG. 3. However, inductor and capacitor are exchanged. Thus, an ESD protection filter between the input node, in the example of FIG. 1 connected to the ESD resistor, and the output node, in the example of FIG. 1 connected to the non-linear circuit, comprises a resistor 510 and a capacitor 540 connected in series. At least one effect can be to keep low frequency currents from reaching the non-linear circuit. Meanwhile, a shunt to ground is provided by a shunt inductor 520. At least one effect can be to direct low frequency current to ground.

In some implementations, as already described above with reference to the ESD protection circuit 200, the inductor 520 of the filter circuit 500 comprises a plurality of windings. In particular, in some embodiments, the inductor 520 has a low quality factor. In some embodiments, the quality factor of the inductor is less than 10. In some embodiments, the quality factor of the inductor is less than 1.

The disclosure of exemplary embodiments herein, where perceived as limited, should be understood to be limited merely for the sake of simplicity of the description. The disclosure must not to be understood as limiting conceptually.

In particular, although the exemplary IC devices illustrated in the drawings and described above comprise but one circuit element in the active circuit portion, for example, in the first embodiment the MOSFET, it should be understood that other IC devices according to the concepts underlying the present disclosure can comprise one or more other active circuit elements.

Also, although the exemplary IC devices illustrated in the drawings and described above comprise but one circuit portion, it should be understood that other embodiments of the IC device can comprise further circuit portions (not shown).

Other portions of an IC device according to the concepts underlying the present disclosure may include one or more other voltage supply nodes to be set to other supply voltage levels. Likewise, it should be understood that the other circuit portions may include one or more other ground nodes to be set to other ground voltage levels.

Further, the predetermined positive supply voltage and the predetermined negative supply voltage are merely stated as examples. The skilled person can configure the voltage supply node and the ground node to be set to other predetermined voltages than disclosed with respect to the examples described above as long as the levels of the predetermined voltage at the voltage supply node and of the predetermined voltage at the ground node of the circuit are not the same.

Further, other circuit elements can be present. In particular, other protective elements such as a Faraday cage provided, for example, by metal shields or a μ-metal cage can be combined with the elements of the embodiments described above.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, and/or, articles of manufacture as indicated by the context described herein.

As used herein, the term 'or' is intended to mean an inclusive 'or' rather than an exclusive 'or.' That is, unless specified otherwise or clear from context, 'X employs A or B' is intended to mean any of the natural inclusive permutations. That is, if X employs A; X employs B; or X employs both A and B, then 'X employs A or B' is satisfied under any of the foregoing instances.

As used herein, the articles 'a' and 'an' should generally be construed to mean 'one or more,' unless specified otherwise or clear from context to be directed to a singular form.

As used herein, the terms 'coupled' and 'connected' may have been used to describe how various elements interface. Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, terms such as 'first', 'second', and the like, are also used to describe various elements, regions, sections, etc. and are also not intended to be limiting.

As used herein, the terms 'at least one' and 'one or more' may be understood to include any integer number equal to one or greater than one, i.e. one, two, three, four, etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Also, it should be appreciated that individual aspects of the implementations may be separately claimed and one or more of the features of the various embodiments may be combined.

The invention claimed is:

1. An integrated circuit device, comprising:
at least one non-linear circuit comprising a plurality of nodes, the plurality of nodes comprising an input node and an output node, wherein a signal output at the output node non-linearly depends on a signal input at the input node, and
a plurality of terminal circuits coupled to the non-linear circuit,
wherein each terminal circuit comprises an associated terminal and an inductor coupled to the associated terminal and to an associated node of the plurality of nodes of the at least one non-linear circuit, a first terminal circuit of the plurality of terminal circuits comprising the inductor directly coupled to the input node, and
wherein the inductor has a low quality factor.

2. The integrated circuit device of claim 1,
wherein the inductor is coupled in series between the associated terminal and the at least one non-linear circuit.

3. The integrated circuit device of claim 1,
wherein the inductor is coupled from a node between the associated terminal and the at least one non-linear circuit to ground.

4. The integrated circuit device of claim 1,
wherein a quality factor of the inductor is less than 10.

5. The integrated circuit device of claim 1,
wherein the inductor is provided as a plurality of segments conductively connected to one another, wherein at least two segments are formed in different layers of the integrated circuit device.

6. The integrated circuit device of claim 1,
wherein the terminal circuit comprises an electro-static discharge protection element that is connected to the associated terminal and coupled to the inductor.

7. The integrated circuit device of claim 6,
wherein the electro-static discharge protection element is configured to form a first filter having a first pole, and
wherein the terminal circuit is configured to form a second filter having at least a second pole, wherein the at least second pole differs from the first pole.

8. The integrated circuit device of claim 7,
wherein the terminal circuit comprises a capacitor coupled between the inductor and ground to provide the second filter.

9. The integrated circuit device of claim 1, further comprising
a conductive shield connected to ground.

10. The integrated circuit device of claim 1,
wherein the at least one non-linear circuit is selected from a group consisting of a transistor, an audio amplifier, an analog-to-digital converter, an integrated circuit, and a micro-electrical mechanical system.

11. The integrated circuit device of claim 1,
wherein the integrated circuit device is configured to be coupled to a transducer configured to provide an electrical signal that represents a pressure variation, and
wherein the at least one non-linear circuit is configured to amplify the electrical signal.

12. A protective device for protection of a circuit, comprising
an electro-static discharge protection element configured to be coupled to a circuit terminal, and an inductor coupled to the electro-static discharge protection element and configured to be coupled to the circuit, the electro-static discharge protection element comprising a thyristor,
wherein the inductor has a low quality factor.

13. The protective device of claim 12,
wherein the inductor is configured to be coupled in series between the electro-static discharge protection element and the circuit.

14. The protective device of claim 12,
wherein the inductor is configured to be coupled from the electro-static discharge protection element to ground.

15. The protective device of claim 12,
wherein a quality factor of the inductor is less than 10.

16. The protective device of claim 12,
wherein the inductor comprises a plurality of windings.

17. The protective device of anyone of claim 12,
wherein the electro-static discharge protection element is configured to form a first filter having a first pole, and
the terminal circuit is configured to comprise a second filter having a second pole, wherein the second pole differs from the first pole.

18. The protective device of claim 17,
wherein the terminal circuit comprises a capacitor coupled between the inductor and ground to provide the second filter.

19. A microphone circuit, comprising:
a transducer configured to provide an electrical signal that represents a pressure variation,
an amplifier circuit coupled to the transducer and configured to amplify the electrical signal, the amplifier circuit comprising a plurality of nodes that includes an input node and an output node, wherein a signal output at the output node depends on a signal input at the input node, and
a plurality of terminal circuits coupled to the amplifier circuit,
wherein each terminal circuit comprises an associated terminal and an inductor coupled to the associated terminal and to an associated node of the plurality of nodes of the amplifier circuit, a first terminal circuit of the plurality of terminal circuits comprising the inductor directly coupled to the input node, and
wherein the inductor has a low quality factor.

20. The microphone circuit of claim 19,
wherein the inductor is coupled in series between the associated terminal and the amplifier circuit.

21. The microphone circuit of claim 20,
wherein the terminal circuit comprises a capacitor coupled between the inductor and ground to provide the second filter.

22. The microphone circuit of claim 19,
wherein the inductor is coupled from a node between the associated terminal and the amplifier circuit to ground.

23. The microphone circuit of claim 19,
wherein a quality factor of the inductor is less than 10.

24. The microphone circuit of claim 19,
wherein the inductor is provided as an integrated circuit element coil.

25. The microphone circuit of claim 19,
wherein the terminal circuit comprises an electro-static discharge protection element that is connected to the associated terminal and coupled to the inductor.

26. The microphone circuit of claim 25,
wherein the electro-static discharge protection element is configured to form a first filter having a first pole, and
wherein the terminal circuit is configured to form a second filter having a second pole, wherein the second pole differs from the first pole.

* * * * *